United States Patent [19]

Tsuchitani et al.

[11] Patent Number: 5,228,341
[45] Date of Patent: Jul. 20, 1993

[54] CAPACITIVE ACCELERATION DETECTOR HAVING REDUCED MASS PORTION

[75] Inventors: Shigeki Tsuchitani, Mito; Seiko Suzuki, Hitachiota; Satoshi Shimada, Hitachi; Masayuki Miki, Katsuta; Masahiro Matsumoto, Hitachi; Yoshihiro Yokota; Shotaro Naito, both of Katsuta, all of Japan

[73] Assignees: Hitachi, Ltd., Tokyo; Hitachi Automotive Engineering Co., Ltd., Ibaraki, both of Japan

[21] Appl. No.: 596,367

[22] Filed: Oct. 12, 1990

[30] Foreign Application Priority Data

Oct. 18, 1989 [JP] Japan ............... 1-268950
Jan. 12, 1990 [JP] Japan ............... 2-3626

[51] Int. Cl.⁵ ........................... G01P 15/125
[52] U.S. Cl. ................... 73/517 R; 73/517 B; 361/280
[58] Field of Search ............. 73/517 R, 517 B, 516 R, 73/514, 651; 361/280, 283; 357/26

[56] References Cited

U.S. PATENT DOCUMENTS

| 2,311,637 | 2/1943 | Buchanan | 73/517 R |
| 4,483,194 | 11/1984 | Rudolf | 73/517 R |
| 4,660,418 | 4/1987 | Greenwood et al. | 73/517 R |
| 4,679,434 | 7/1987 | Stewart | 73/517 R |
| 5,006,487 | 4/1991 | Stokes | 73/517 R |
| 5,044,201 | 9/1991 | Farace et al. | 73/516 R |

Primary Examiner—John E. Chapman
Attorney, Agent, or Firm—Antonelli, Terry, Stout & Kraus

[57] ABSTRACT

Disclosed is an acceleration detector which has an electrically conductive mass portion formed at a free end of a cantilever, and fixed electrodes arranged opposite to the mass portion through a gap so that the value of acceleration is detected on the basis of the change of capacitance between the mass portion and the fixed electrodes, and in which at least one space is formed in the inside of the mass portion to lighten the weight of the mass portion to thereby widen the range of measurement.

10 Claims, 7 Drawing Sheets

CAPACITIVE ACCELERATION DETECTOR HAVING REDUCED MASS PORTION

BACKGROUND OF THE INVENTION

The present invention relates to an acceleration detector, and particularly relates to an acceleration detector suitable for controlling a car or the like.

Heretofore, as an acceleration detector, there have been proposed a piezoelectric acceleration detector using a piezoelectric effect of a piezoelectric material, a distortional-gauge acceleration detector using a piezo-resistance effect, a servo acceleration detector having a force feedback mechanism, a magnetic acceleration detector using a differential transformer, an optical acceleration detector using a photointerrupter, a capacitance-operated acceleration detector using capacitance between electrodes formed by evaporation coating, and the like.

Of those acceleration detectors, the capacitance-operated acceleration detector is considered to be most promising for the future.

The capacitance-operated acceleration detector is described in the publication "Transducers '87, Digest of Technical Papers", pages 395-398, 1987.

According to this publication, a displaceable mass is attached to a free end of a cantilever so that the mass displaces upon application of acceleration.

Further, electrodes are provided at the mass portion and a fixed portion opposite to the mass portion to thereby form a capacitance. The displacement of the mass is detected on the basis of the change of capacitance between the mass portion and the fixed portion and the result of detection is fed back to thereby forcedly keep the mass portion at a neutral point by electrostatic force.

Accordingly, the value of acceleration is detected on the basis of the feedback quantity at this time.

In the aforementioned, capacitance-operated acceleration detector, the sensitivity of detection is high but the range of measurement is narrow. To widen the range of measurement, a high driving voltage is required.

However, a first problem arises in that a boosting circuit or the like is required in the case where the value of source voltage is restricted, for example, in a car or the like.

Further, a second problem in, such an acceleration sensor arises from the fact that the gap between the electrode and the mass portion is of the order of microns so that, the gap may be short-circuited in the case where foreign matter invades into the gap.

In this case, an indirect method of testing an electric output has been used for examination of a possible short circuit. There arises a manufacturing problem in that a large time is required for such operation.

This is because, in the currently proposed acceleration sensor, the electrodes are formed of aluminum by evaporating a coating or sputtering, and therefore the electrodes are opaque so that checking cannot be performed from the outside.

SUMMARY OF THE INVENTION

An object of the present invention is to provide an acceleration detector in which the range of measurement of acceleration can be widened with no necessity of increasing the driving voltage.

Another object of the invention is to provide an acceleration detector in which the checking of the electrodes and the mass portion can be performed from the outside.

A feature of the acceleration detector according to the present invention in that the acceleration detector is constructed so that the mass of the mass portion is reduced as much as possible without changing the areas of the electrodes.

According to such a configuration of the acceleration detector, the range of measurement can be widened even though the voltage is low, because the mass can be lightened without changing the areas of the electrodes.

A second feature of the acceleration detector according to the present invention resides in the fact that, electrodes are used through which the gap between the electrodes and the mass portion can be seen.

According to such a configuration of the acceleration detector, the gap between the electrodes and the mass portion can be seen through the electrodes to judge whether or not foreign matter exists. Accordingly, the checkup time can be shortened greatly.

DESCRIPTION OF THE PREFERRED EMBODIMENTS

The first aspect of the present invention will be described with reference to the drawings.

Figure 2:
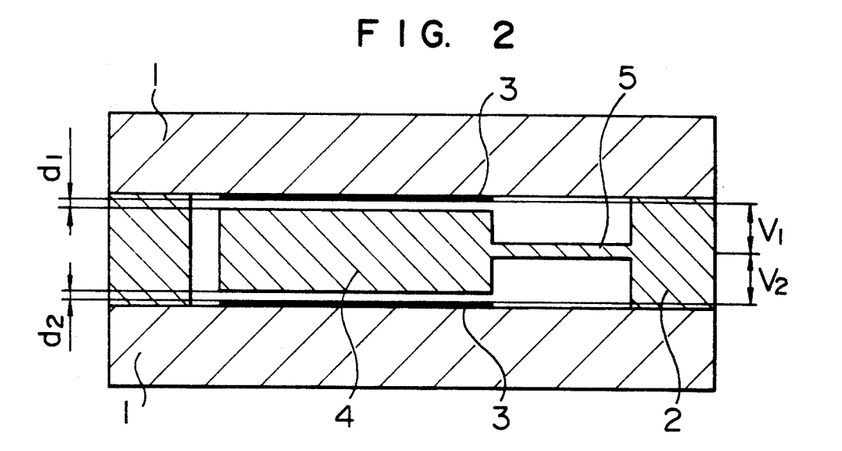
FIG. 2 is a sectional view for explaining the concept according to the first aspect of the present invention.

Referring now to FIG. 2, the concept of the first aspect of the present invention is described below.

In FIG. 2 the reference numeral 2 designates an electrically conductive substrate in which a movable electrode 4 composed of a cantilever 5 and a mass portion is formed. Electrically insulating substrates 1 are stuck to the electrically conductive substrate 2 at the upper and lower portions thereof, and fixed electrodes 3 are respectively provided on surfaces of the electrically insulating substrates at positions to the movable electrode 4.

When the mass of the movable electrode 4 is represented by m, the force of inertia acting on the movable electrode 4 at the time of application of acceleration is expressed by the equation (1).

$$F_1 = m \cdot \alpha \tag{1}$$

Assume that the displacement of the movable electrode 4 is sufficiently small and that the electrode 4 remains substantially parallel, to the upper and lower fixed electrodes 3 during movement. Let $d_1$ and $d_2$ be gaps between the movable electrode 4 and the upper fixed electrode 3 and between the movable electrode 4 and the lower fixed electrode 3, respectively. If voltages $V_1$ and $V_2$ are applied between the movable electrode 4 and the upper fixed electrode 3 and between the movable electrode 4 and the lower fixed electrode 3, respectively, electrostatic force acting on the movable electrodes 3 is expressed by the equation:

$$F_2 = \frac{\epsilon \cdot S \cdot V_1^2}{d_1^2} - \frac{\epsilon \cdot V_2^2}{d_2^2} \tag{2}$$

in which $\epsilon$ represents a dielectric constant of a medium existing in the gaps, and S represents an effective surface area of each fixed electrode 3 opposite to the movable electrode 4.

Assuming now that a servo system is stabilized in the case of $d_1 = d_2 = d$, then the following equation (3) is established.

$$\begin{aligned} F_2 &= \frac{\Delta \cdot S \cdot V_1^2}{d_1^2} - \frac{\epsilon \cdot S \cdot V_2^2}{d_2^2} \\ &= \frac{\epsilon \cdot S}{d^2}(V_1^2 - V_2^2) \end{aligned} \tag{3}$$

Further, when the surface area, thickness and density of the movable electrode 4 are represented by S, t and $\rho$, respectively, the mass of the movable electrode 4 is expressed by the following equation.

$$m = S \cdot t \cdot \rho \tag{4}$$

Accordingly, when the restoring force of the cantilever 5 can be ignored and the inertial force $F_1$ and the electrostatic force $F_2$ are well-balanced, the following equation (5) is obtained from the equations (1), (3) and (4).

$$S \cdot t \cdot \rho \cdot \alpha = \frac{\epsilon \cdot S}{d^2}(V_1^2 - V_2^2) \tag{5}$$

Accordingly, the following equation (6) is obtained.

$$\alpha = \frac{\epsilon}{d^2 \cdot t \cdot \rho}(V_1^2 - V_2^2) \tag{6}$$

To widen the range of measurement of acceleration $\alpha$, the following four methods can be suggested by the equation (6):

(a) A method of reducing the gap d between the movable electrode 4 and the respective fixed electrode 3;

(b) A method of reducing the thickness t of the movable electrode 4;

(c) A method of reducing the density $\rho$ of constituent parts of the movable electrode 4; and (d) A method of enlarging the value $(V_1^2 - V_2^2)$. To widen the range of measurement with respect to the positive value of acceleration, a method of enlarging the value of $V_1$ and reducing the value of $V_2$ can be suggested. To widen the range of measurement with respect to the negative value of acceleration, a method of reducing the value of $V_1$ and enlarging the value of $V_2$ can be suggested. In short, in the case where both the positive and negative values of acceleration are considered, it is important that large values of $V_1$ and $V_2$ can be applied.

However, the following problem arises in the method of (a). As the gap d decreases, it becomes more difficult to control the gap d with high accuracy, because of the influence of machining accuracy, deposition of foreign matter in the gap, and so on.

In the method of (d), electric source circuits must be interchangeably provided to boact the application voltages. In some cases, accordingly, it may be difficult to apply this method to a car or the like.

On the other hand, in the methods of (b) and (c), the mass of the movable electrode 4 can be lightened relatively easily. In semiconductor acceleration sensors, Si is in most cases used as a very excellent sensor material. It is difficult to reduce the density $\rho$ of the material, but the average density of the movable electrode can be reduced by providing a cavity (or cavities) in its inside.

For the aforementioned reasons, the present invention has been achieved based on lightening the mass of the movable electrode 4 as suggested in the above methods of (b) and (c).

Figure 1:
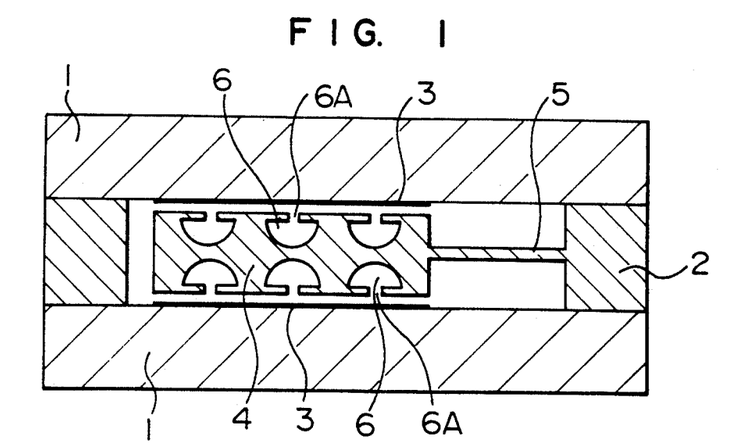
FIG. 1 is a sectional view showing a basic structure according to a first aspect of the present invention.

FIG. 1 shows a basic structure to attain the method o (c).

Cavities 6 having openings 6A opened toward fixed electrodes 3 are provided in the inside of a movable electrode 4. The diameter of each of the openings 6A is established so as to be as small as possible, so as to avoid reduction of the surface area S of the movable electrode 4 as much as possible. The size of each of the cavities 6 is established so as to be as large as possible to thereby reduce the average density $\rho$ of the movable electrode 4 in the range that the mechanical strength of the movable electrode 4 is kept sufficiently high.

As is obvious from the equation (6), the range of measurement of acceleration is inversely proportional to the average density $\rho$ of the movable electrode.

When the total volume of the cavities formed is represented by M, the range of measurement is inversely proportional to the average density $\rho$ as follows.

$$\text{Range of Measurement} \propto 1/\rho \frac{S \cdot t}{S \cdot t - M}$$

In short, the range of measurement is widened as M increases. For example, in the case of $M = S \cdot t/2$, the range of measurement is doubled.

Figure 3:
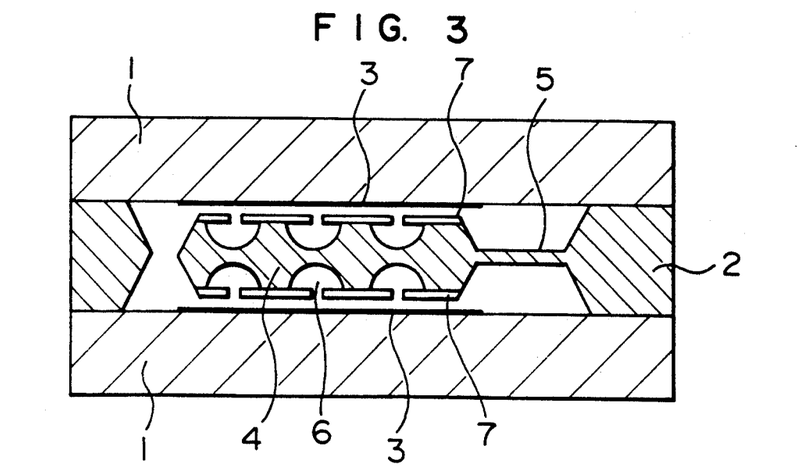
FIGS. 3 and 5 are sectional views showing the structure of FIG. 1 more specifically.
Figure 4:
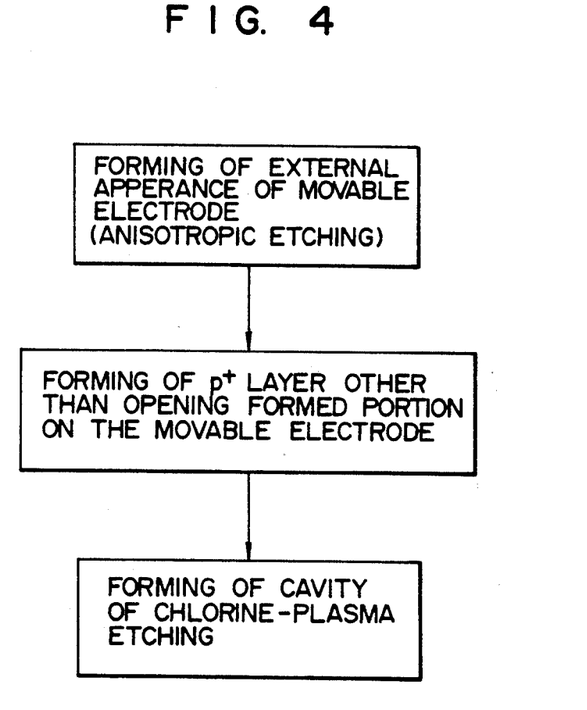
FIG. 4 is a schematic flow chart of a process for producing the structure of FIG. 3.

FIG. 3 shows a specific structure to attain the structure of FIG. 1. In FIG. 3, the reference numeral 1 designates a pair of glass substrates in which at least one fixed electrode 3 is formed on one surface of each of the glass substrates by means of photolithography or the like. The reference numeral 2 designates a silicon substrate in which a movable electrode 4 and a cantilever 5 are formed by means of anisotropic etching such as alkali etching or the like. Etching exhibiting dependency of etching rate upon impurity concentration is used for forming the cavities 6. For example, in the case of plasma etching using chlorine plasma or in the case of light-excited dry etching, the dependency upon the kind of impurities and the concentration thereof is as follows: n+>n>p>p+. FIG. 4 shows the outline of a process for forming the cavities 6 in the movable electrode 4 by using such an etching method. The external appearance of the movable electrode 4 is formed by anisotropic etching. Then, a p+ layer as a low-etching-rate impurity layer 7 is formed by heat dispersion or ion implanting. Thereafter, chlorine-plasma etching is carried out. When etching progresses from the surface region except the p+ layer to a depth more than the thickness of the p+ layer, the rear side of the p+ layer is etched (under-cut) to enlarge the volume of the respective cavity 6.

After the treatment for the silicon substrate and the glass substrates has been finished, the three substrates are stacked on one another and stuck by anode junction.

According to this embodiment, an effect of lightening the mass of the movable electrode can be attained by a simple process using the dependency of etching rate of silicon upon impurity concentration.

Figure 5:
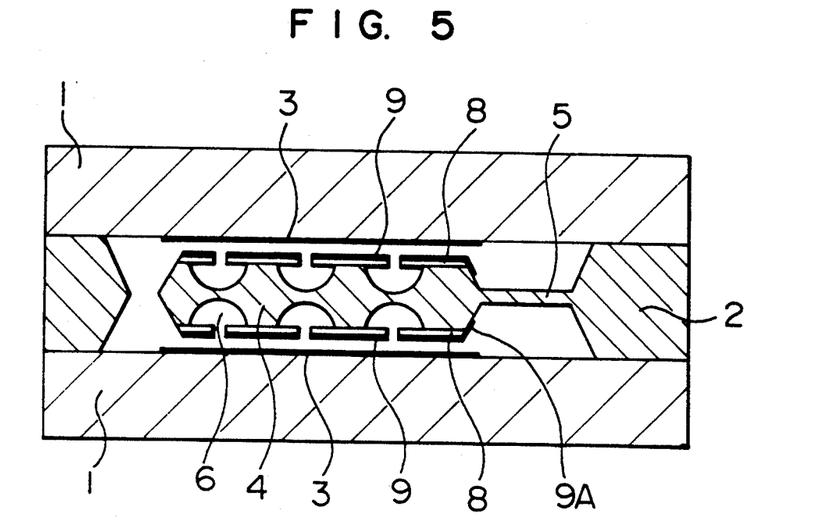

FIG. 5 shows another specific structure to attain the structure of FIG. 1. After the external appearance of the movable electrode 4 is formed, the inside of the movable electrode 4 is etched to form cavities 6 while masked with an electrically insulating layer 8 such as silicon nitride layer or the like. In this embodiment, ordinary isotropic wet etching can be used as silicon etching. Before the mask of the electrically insulating layer 8 such as a silicon nitride layer or the like is formed or after the cavities 6 are formed, an electrically conductive layer 9 is formed on the surface of the electrically insulating layer 8 such as a silicon nitride layer or the like to thereby prepare an electrode. In this embodiment, the electrically conductive layer 9 is electrically connected to the cantilever 5 by a lead 9A.

According to the aforementioned embodiment, an effect of lightening the mass of the movable electrode 4 can be attained by a process technique which has been well used heretofore.

In short, the aforementioned embodiment shows a technique of forming fine holes at the surface of the movable electrode 4 and further applying etching thereto to form large cavities 6 in the inside of the movable electrode.

On the contrary, a movable electrode 4 having a large cavity in its inside with no connection to its outside or a movable electrode having a more complex form can be formed by using a silicon junction technique.

Figure 6:
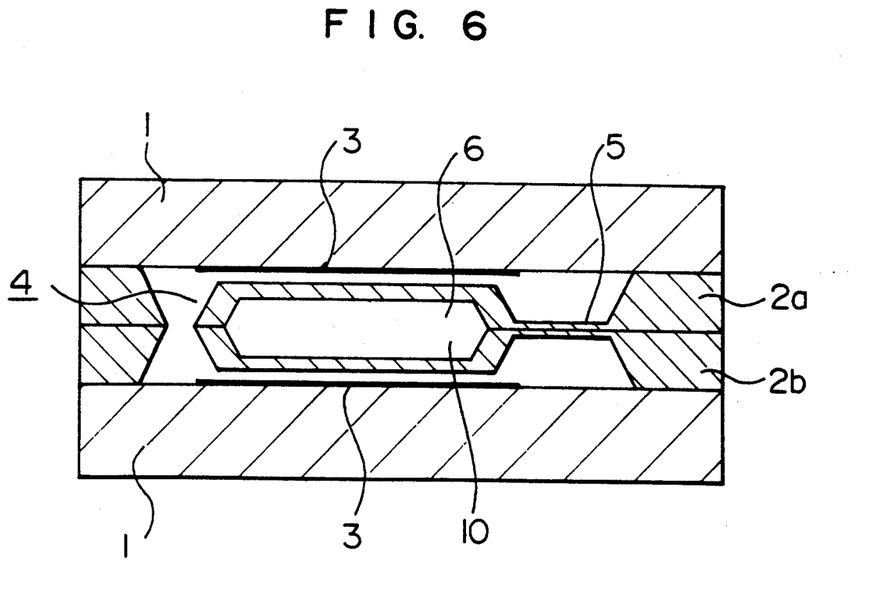
FIG. 6 is a sectional view showing another structure according to the first aspect of the present invention.

FIG. 6 shows a structure of a sensor having a cavity 6 only in the inside of the movable electrode 4. Two silicon substrates 2a and 2b each having a concave portion 10 equivalent to the half of the cavity 76 are stuck to each other by using a silicon direct junction technique to prepare one substrate having the cavity 6 in its inside. At the time of forming the junction, the crystal directions of the two silicon substrates 2a and 2b are well-matched.

Thereafter, a movable electrode 4, a cantilever 5 and the like are formed by using ordinary anisotropic etching to form a cavity 6 in the inside of the movable electrode 4. As to the method of treatment of the glass substrates 1 and the method of sticking the silicon substrates 2a and 2b to the glass substrates 1, this embodiment is the same as the previous embodiment.

According to this embodiment, the mass of the movable electrode can be lightened by anisotropic etching in the same manner as in the conventional sensor, through the silicon direct junction technique.

Figure 7:
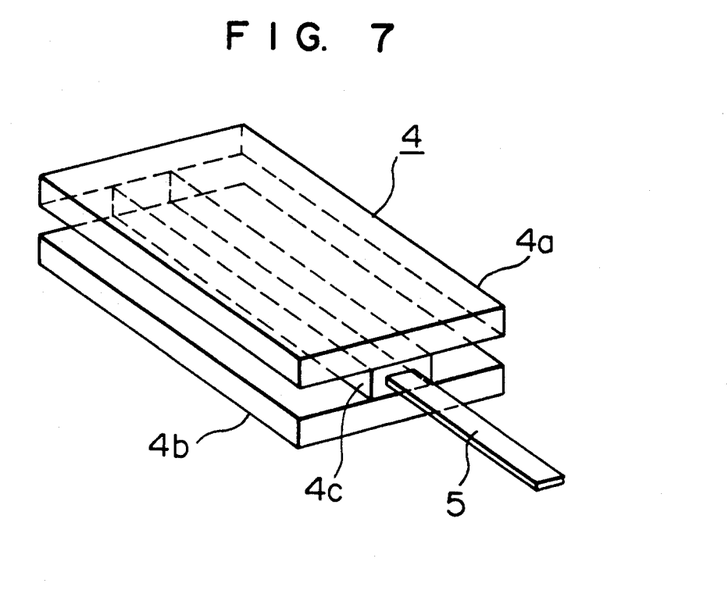
FIG. 7 is a structural view of a movable electrode portion using a silicon-silicon direct junction.

A more complex movable electrode 4 as shown in FIG. 7 can be formed by using the silicon direct junction technique.

In FIG. 7, the movable electrode 4 has a flat I structure in which cavities are formed in opposite sides of a supporting portion 4c connecting upper and lower surfaces 4a and 4b.

Accordingly, the mass of the movable electrode 4 can be lightened gradually.

In the following, a structure in which the thickness of the movable electrode is reduced by the method of (b) is described.

The simplest method to reduce the thickness of the movable electrode is a method using a thin substrate. However, the thickness of a wafer is restricted from the point of view of handling property and strength.

Figure 8:
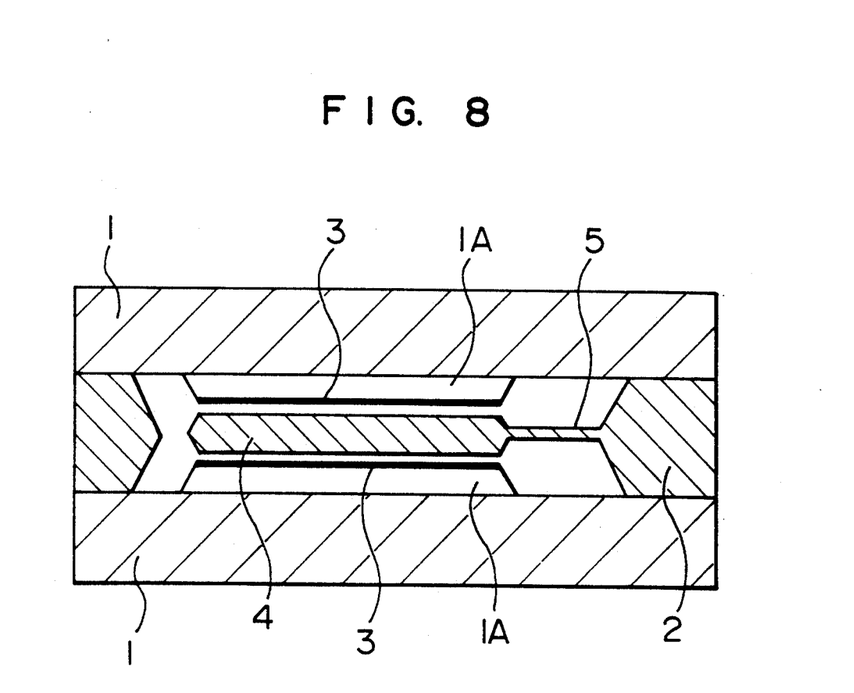
FIGS. 8 and 9 are sectional views showing further structures according to the first aspect of the present invention.

FIG. 8 shows a structure in which the thickness of the movable electrode 4 is reduced by etching. To keep the size of the gap between the movable electrode 4 and the respective fixed electrode 3, the fixed electrode portion 1A in which the fixed electrode 3 is formed is thickened inversely proportionally to the reduction of the thickness of the movable electrode 4. The movable electrode 4 and the cantilever 5 have a relation in which the thickness of the fixed portion of the cantilever 5 is larger than the thickness of the movable electrode 4, which is in turn larger than the thickness of the middle portion of the cantilever 5.

It is apparent from the equation (6) that the range of measurement is doubled when the thickness t is halved.

According to this embodiment, an effect of lightening the mass of the movable electrode can be attained by a simple structure.

Figure 9:
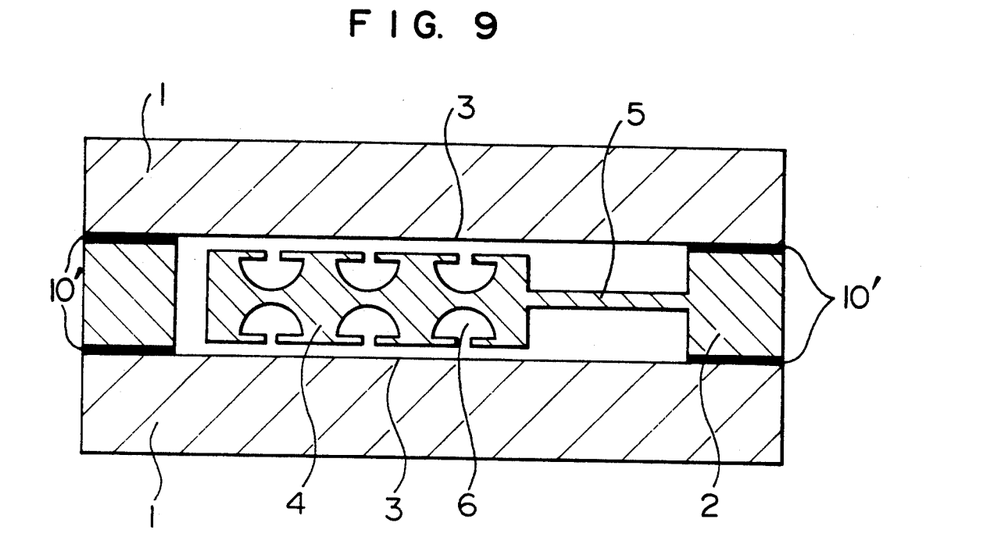

Although this embodiment has shown the case where the substrates 1 vertically opposite to each other with respect to the movable electrode 4 as shown in FIG. 9 are provided by forming electrodes on electrically insulating substrates, it is a matter of course that the present invention is not limited to the specific embodiment and that the present invention can be applied to the case were the substrates 1 are formed of silicon. In this case, the silicon substrates 1 are stuck to the middle silicon substrate through electrically insulating layers 10' and 10' such as glass, silicon oxide or the like.

In the case where the movable electrode 4 and the respective fixed electrode 3 are brought into contact with each other for some reason under the condition that a voltage is applied between the electrodes 4 and 3, the electrodes may be stuck to each other by heating because of a current having large current density. In this case, the sticking of the electrodes can be prevented by providing a very thin electrically insulating layer on the surface of the movable electrode 4 or on the surface of the fixed electrode 3.

According to the first aspect of the present invention, an effect of widening the range of measurement in the acceleration detector can be attained with no necessity of changing the driving voltage. For example, in the case where a cavity with the volume equal to the half of the whole volume of the movable electrode is formed or in the case where the thickness of the movable electrode is halved, the range of measurement is doubled. This is particularly effective in the case where the source voltage is restricted.

In the following, the second aspect of the present invention is described.

Figure 10:
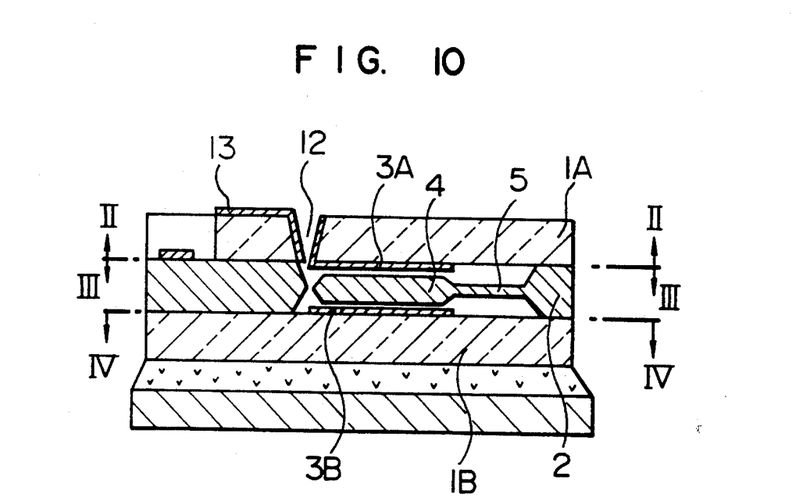
FIG. 10 is a sectional view of an acceleration sensor as an embodiment according to the second aspect of the present invention.

In FIG. 10, the reference numeral 2 designates a plate of silicon (hereinafter called a "silicon plate"). Transparent substrates 1A and 1B of glass or the like are fixed to opposite sides of the silicon plate 2. Each of the transparent substrates 1A and 1B serves as an electric insulator.

A cantilever 5 having a weight 4 as a mass portion is formed as a part of the silicon plate 5. Fixed electrodes 3A and 3B opposite to each other are provided on the opposite sides of the cantilever 5.

The fixed electrodes 3A and 3B are fixed to the transparent substrates 1A and 1B, respectively, and connected to a lead-out wire 13 through a through-hole 12.

Figure 11:
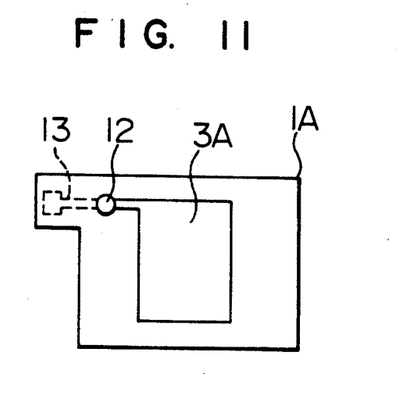
FIG. 11 is a sectional view taken along the line II—II in FIG. 10.
Figure 12:
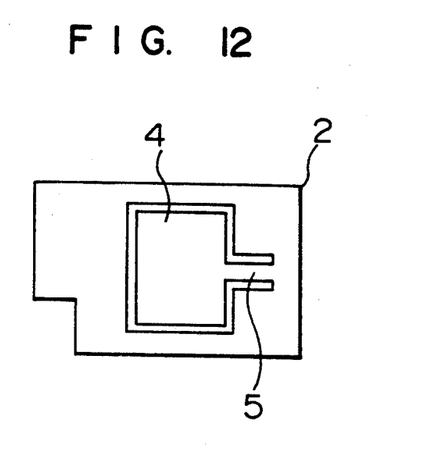
FIG. 12 is a sectional view taken along the line III—III in FIG. 10.
Figure 13:
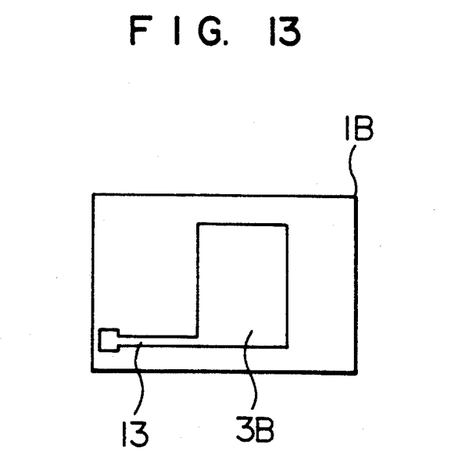
FIG. 13 is a sectional view taken along the line IV—IV in FIG. 10.

This acceleration sensor is composed of three members as shown in FIGS. 11 through 13. FIGS. 11 and 13 show the transparent substrates 1A and 1B on which the rectangular electrodes 3A and 3B are formed. On the other hand, FIG. 12 shows the silicon plate 2 in which the weight 4 and the cantilever 5 are separately formed in the inside.

Figure 14:
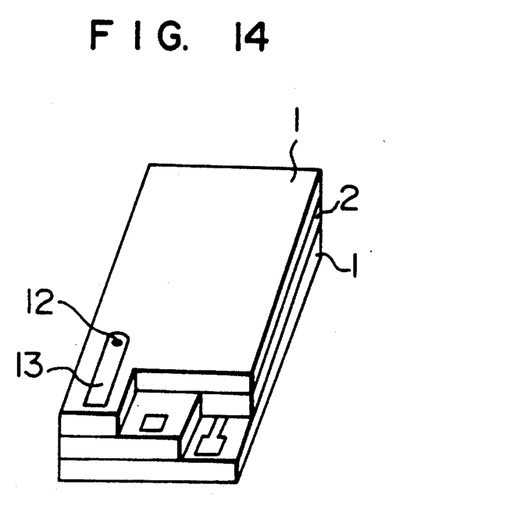
FIG. 14 is a perspective view of the acceleration sensor assembled.

FIG. 14 shows the assembled state of the three members.

The second aspect of the present invention has a feature in that the weight 4 in the aforementioned acceleration sensor is made visible through the fixed electrodes 3A and 3B.

In the following, the aforementioned acceleration sensor is described more in detail.

In FIG. 10, the fixed electrodes 3A and 3B are formed of an indium oxide-tin material.

The indium oxide-tin material is fixed to the transparent substrates 1A and 1B by high-frequency ion plating.

When an indium oxide-tin film is formed by high-frequency ion plating as described above, the fixed electrodes 3A and 3B are formed as transparent electrodes. Accordingly, the weight 4 can be observed with eyes through the transparent substrates 1A and 1B and the transparent electrodes 3A and 3B.

Because such a structure in which the weight 4 can be observed with eyes can be formed as described above, the invasion of foreign matter can be checked from the outside so that the checkup time can be shortened.

Although this embodiment has shown the case where indium oxide-tin is used as an electrode material, the present invention is not limited to the specific embodiment. For example, by use of any other material, such as indium oxide, a tin oxide, or the like, transparent electrodes can be formed similarly to the above case.

In the case where electrodes are formed by using high-frequency ion plating, a lead-out portion 13 including a through hole 12 can be formed. Accordingly, in this case, another effect of exact connection between the electrodes 3A and 3B and the lead-out wire 13 can be attained.

In the following, further embodiments according to the second aspect of the present invention are described with reference to FIGS. 15 and 16.

Figure 15:
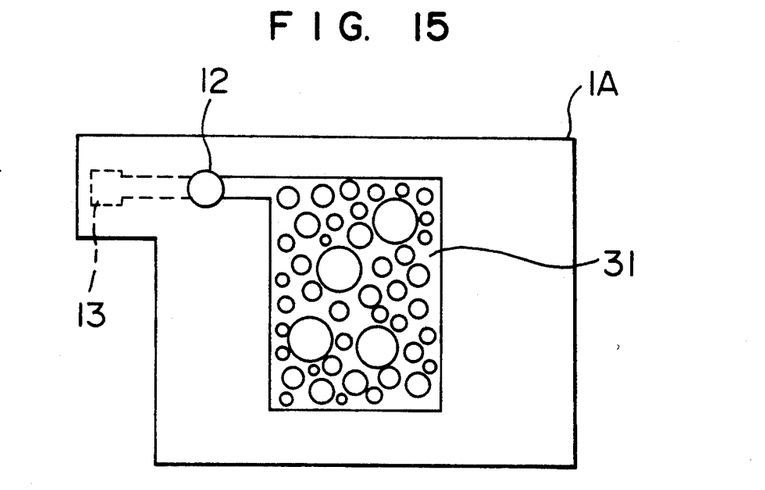
FIGS. 15 and 16 are front views showing the form of electrode as further embodiments of the present invention.
Figure 16:
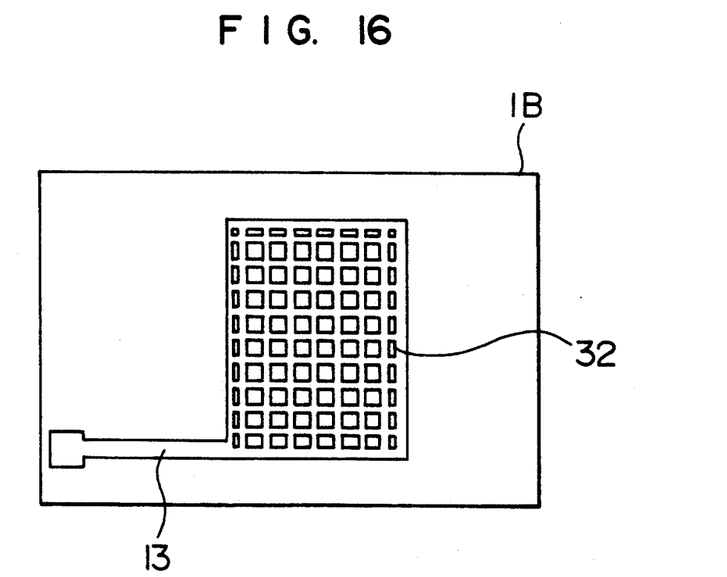

Although the previous embodiment has shown the case where transparent electrodes are formed of indium oxide-tin by high-frequency ion plating, the embodiments in FIGS. 15 and 16 show the case where each of aluminum electrodes is shaped like a net so as to be visible.

In FIGS. 15 and 16, a round-hole electrode 31 and a rectangular-hole electrode 32 are shown as an example of the net form. In short, any suitable net-like electrode can be used.

When the net-like electrodes are employed as described above, the transparent glass substrate can be seen through the net-like electrodes. Accordingly, the weight 4 can be seen through the net-like electrodes and the glass substrate.

In this case, aluminum or the like can be used as an electrode material. Further, the lead-out wire 13 and the fixed electrodes 31 and 32 can be formed when the electrodes are formed by high-frequency ion plating. Accordingly, exact connection between the lead-out wire 13 and the fixed electrodes 31 and 32 through the through hole 12 can be attained.

Because a structure in which the mass portion such as a weight or the like can be observed visually through the fixed electrodes can be attained as described above, the invasion of foreign matter can be checked from the outside.

What is claimed is:

1. An acceleration detector comprising:
    (a) a pair of substrates respectively having electrically insulating surfaces disposed opposite to each other;
    (b) fixed electrodes respectively provided on said electrically insulating surfaces of said pair of substrates;
    (c) a cantilever having a fixed end supported between said pair of substrates, and a free end which is freely swingable in an area between said pair of substrates; and
    (d) an electrically conductive mass substance formed at said free end of said cantilever so as to be freely swingable in between said fixed electrodes and containing at least two spaces in its inside, in which said spaces inside of said mass substance respectively communicate by way of openings formed in surfaces of said mass substance which are opposite to said fixed electrodes, the diameter of said openings being smaller than the dimension of said spaces in a direction parallel to said surfaces.

2. An acceleration detector according to claim 1, in which said mass substance is formed of silicon, and in which the surfaces of said mass substance except said small openings are formed of a low-etching-rate impurity layer.

3. An acceleration detector according to claim 1 in which said mass substance is formed of silicon, and in which the surfaces of said mass substance except said small openings are successively covered with an electrically insulating layer and an electrically conductive layer, said electrically conductive layer being connected to said silicon.

4. An acceleration detector comprising:
    first and second fixed electrodes disposed in spaced relation to each other; and
    a third movable electrode having a mass portion interposed between and spaced from said first and second fixed electrodes by predetermined gaps and a fixed cantilever portion supporting said mass portion for free movement toward and away from said first and second fixed electrodes in response to an acceleration force;
    wherein said mass portion of said third movable electrode is provided with a plurality of internal empty cavities which each communicate with a surface of the mass portion by way of a hole which is smaller than the size of the cavity.

5. An acceleration detector according to claim 4, wherein said mass portion of said third movable electrode is made of a conductive material.

6. An acceleration detector according to claim 4, wherein said mass portion of said third movable electrode comprises a substrate having a plurality of empty cavities in respective surfaces thereof which face said first and second fixed electrodes and conductive layers which overlay said surfaces and cover said cavities.

7. An acceleration detector according to claim 4, wherein said holes which communicate with said cavities are formed in said layers.

8. An acceleration detector according to claim 6, further including an insulating mask layer interposed between said conductive layer and a surface of said substrate.

9. An acceleration detector according to claim 8, wherein said holes which communicate with said cavities pass through said conductive layers and insulating mask layers.

10. An acceleration detector according to claim 4, wherein the shape of said third movable electrode is symmetrical with respect to a center axis passing through said cantilever portion so as to respond substantially only to acceleration components which are perpendicular to said center axis.

* * * * *